(12) United States Patent
Venkatasubramanian et al.

(10) Patent No.: US 9,059,583 B2
(45) Date of Patent: *Jun. 16, 2015

(54) ESD PROTECTION SCHEME FOR DESIGNS WITH POSITIVE, NEGATIVE, AND GROUND RAILS

(71) Applicant: Broadcom Corporation, Irvine, CA (US)

(72) Inventors: Ramachandran Venkatasubramanian, Phoenix, AZ (US); Robert Elio, Mesa, AZ (US)

(73) Assignee: Broadcom Corporation, Irvine, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/153,634

(22) Filed: Jan. 13, 2014

(65) Prior Publication Data
US 2014/0126095 A1 May 8, 2014

Related U.S. Application Data

(63) Continuation of application No. 12/461,550, filed on Aug. 14, 2009, now Pat. No. 8,630,071.

(60) Provisional application No. 61/162,858, filed on Mar. 24, 2009.

(51) Int. Cl.
| H02H 9/00 | (2006.01) |
| H02H 9/04 | (2006.01) |
| H01L 27/02 | (2006.01) |

(52) U.S. Cl.
CPC ........... *H02H 9/046* (2013.01); *H01L 27/0251* (2013.01); *H01L 27/0292* (2013.01)

(58) Field of Classification Search
CPC .................................................... H01L 27/0251
USPC ............................................................ 361/56
See application file for complete search history.

(56) References Cited

U.S. PATENT DOCUMENTS

| 5,617,283 A | 4/1997 | Krakauer et al. |
| 5,721,658 A | 2/1998 | Ma et al. |

(Continued)

FOREIGN PATENT DOCUMENTS

| CN | 101141063 A | 3/2008 |
| EP | 0 845 848 A2 | 6/1998 |

OTHER PUBLICATIONS

English-Language Abstract of Chinese Patent Publication No. CN 101141063 A, published Mar. 12, 2008; 2 pages.

(Continued)

*Primary Examiner* — Stephen W Jackson
(74) *Attorney, Agent, or Firm* — Sterne, Kessler, Goldstein & Fox P.L.L.C.

(57) ABSTRACT

Apparatuses and systems for dissipating ESD events are provided. In an embodiment, an integrated circuit (IC) device, includes a ground rail, a positive supply rail, a negative supply rail, a circuit block, a plurality of contact pads, the circuit block being configured to output an output voltage via a first contact pad of the plurality of contact pads and a range of the output voltage being is between a voltage of the positive supply rail and a voltage of the negative supply rail, and a coupling system that couples the first contact pad to a second contact pad of the plurality of contact pads so as to dissipate an electrostatic discharge (ESD) event between the first and second contact pads.

20 Claims, 7 Drawing Sheets

(56) References Cited

U.S. PATENT DOCUMENTS

| | | | |
|---|---|---|---|
| 6,144,542 | A | 11/2000 | Ker et al. |
| 6,281,735 | B1 | 8/2001 | Page |
| 6,724,603 | B2 * | 4/2004 | Miller et al. .................. 361/111 |
| 7,129,752 | B2 | 10/2006 | Bayer |
| 7,463,466 | B2 * | 12/2008 | Hsueh et al. .................... 361/56 |
| 8,208,233 | B2 * | 6/2012 | Lin ................................. 361/56 |
| 8,630,071 | B2 | 1/2014 | Venkatasubramanian et al. |
| 2006/0138544 | A1 | 6/2006 | Bakker |
| 2010/0246074 | A1 | 9/2010 | Venkatasubramanian et al. |

OTHER PUBLICATIONS

Chinese Office Action directed to related Chinese Patent Application No. 201010155654.3, mailed Jun. 25, 2013; 9 pages.

Boxleitner, Warren, "How to defeat electrostatic discharge," IEEE Spectrum, Aug. 1989, pp. 36-40.

Ker, M.D., "ESD (Electrostatic Discharge) Protection Design for Nanoelectronics in CMOS Technology," IEEE Communications, Advance Signal Processing, Circuits, and System Design Techniques, May 1, 2006, pp. 217-279.

Robinson, Lon, "Evaluate Clamping Voltages for ESD Protection," EE Times-Asia, Sep. 1, 2007, eetasia.com, 2 pages.

Wang, Albert Z.H., "On-Chip ESD Protection for Integrated Circuits: An IC Design Perspective," 2002.

Yen et al., "Failure of On-Chip Power-Rail ESD Clamp Circuits During System-Level ESD Test," IEEE 07CH37867 45th Annual International Reliability Physics Symposium, 2007, pp. 598-599.

International Search Report for European Patent Application No. 10002756, European Patent Office, Germany, mailed on Feb. 1, 2012.

* cited by examiner

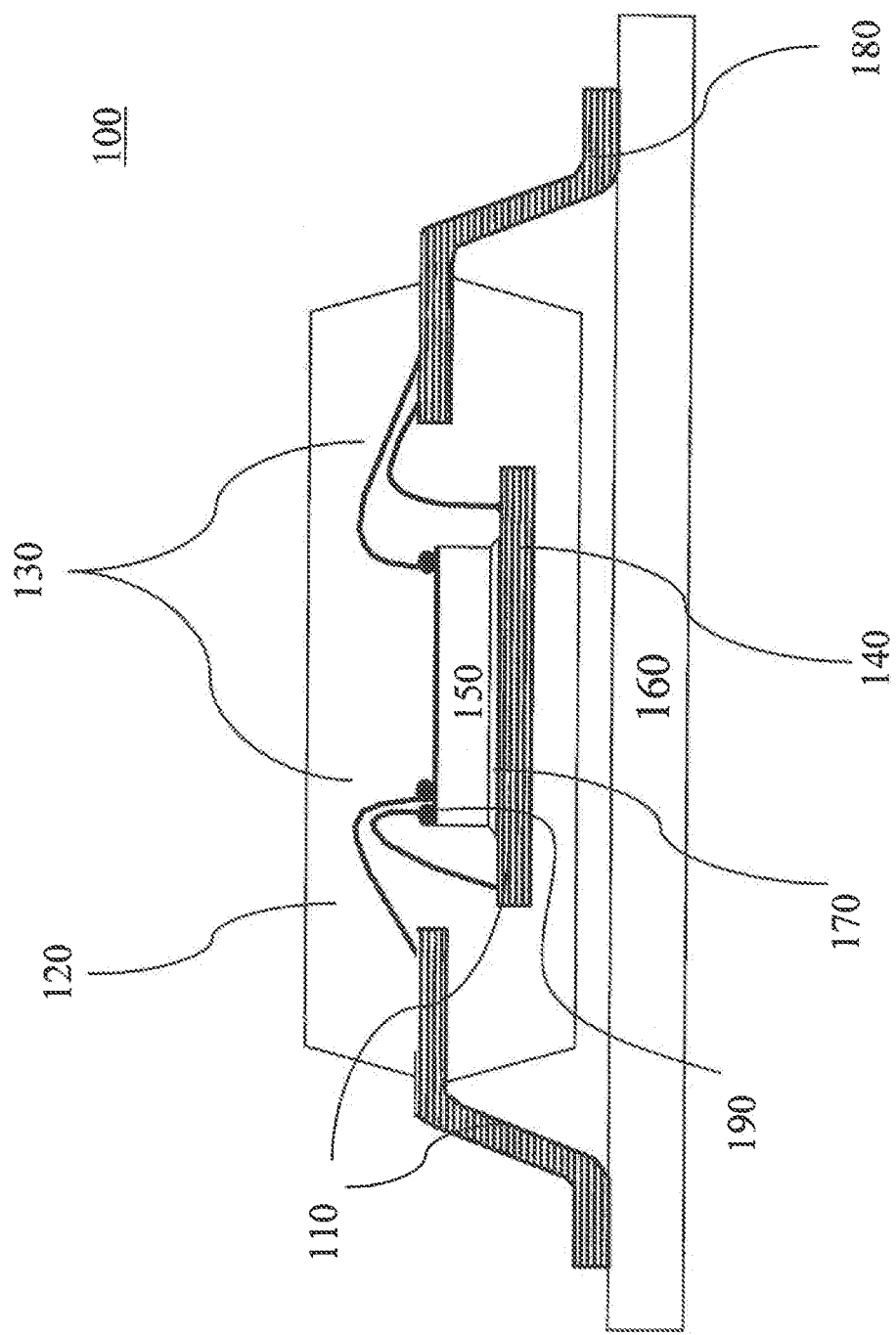
FIG. 1
Conventional

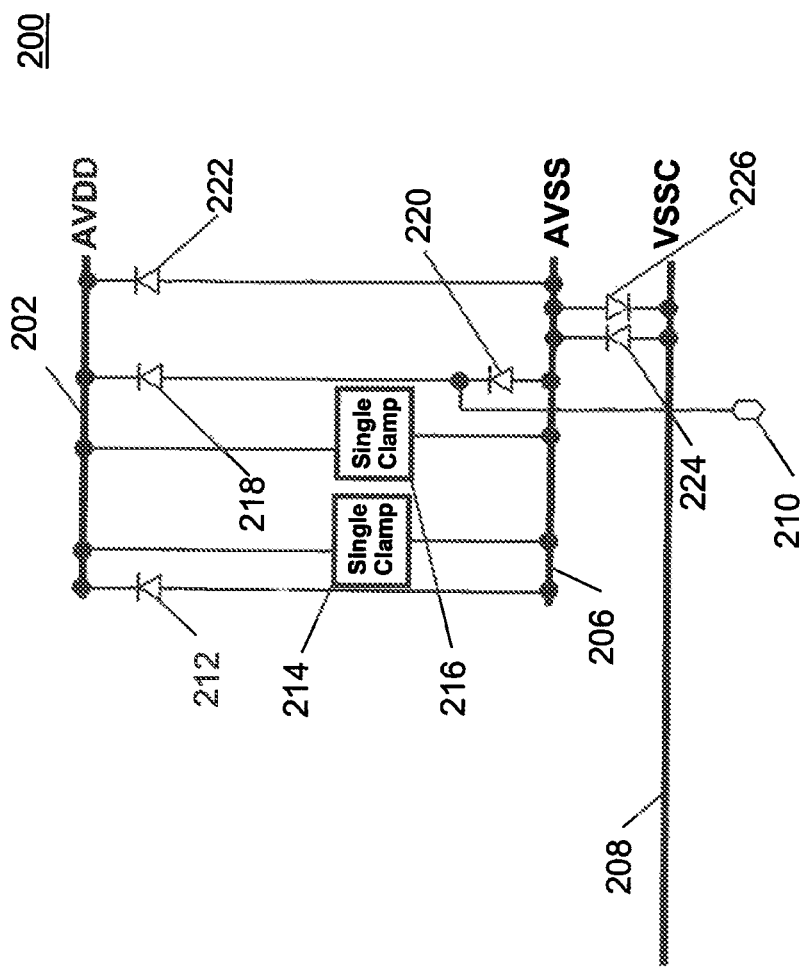
FIG. 2
Conventional

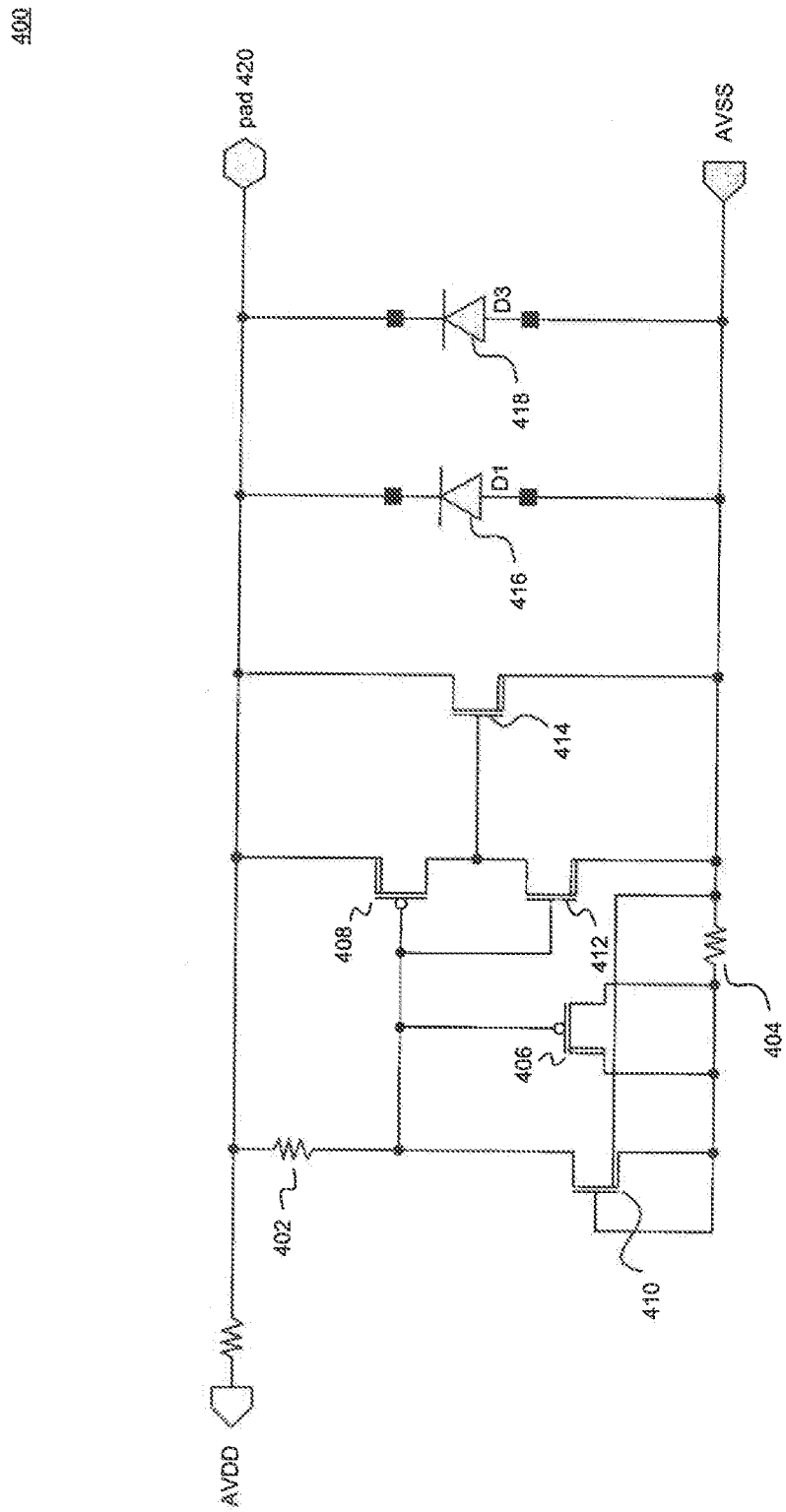
FIG. 4
Conventional

ESD PROTECTION SCHEME FOR DESIGNS WITH POSITIVE, NEGATIVE, AND GROUND RAILS

CROSS REFERENCE TO RELATED APPLICATIONS

This application is a continuation of U.S. Non-Provisional application Ser. No. 12/461,550, filed Aug. 14, 2009, now allowed, which claims the benefit of U.S. Provisional Appl. No. 61/162,858, filed Mar. 24, 2009, both of which are incorporated by reference herein in their entireties.

BACKGROUND OF THE INVENTION

1. Field of the Invention

The present invention deals with providing low-resistance paths between pads of a circuit to facilitate the dissipation of ESD current.

2. Background Art

Electrostatic discharge (ESD) events result in high voltage and current transients that can damage electrical devices. For example, if these transient voltages and currents are not safely discharged, they can generate heat. This generated heat can, for example, damage elements of an integrated circuit (IC). Thus, a goal of ESD protection devices is to facilitate the safe discharge ESD event transients. Further, voltage amplitudes of the transient voltages can exceed the breakdown voltage of transistor devices, which causes failure.

To prevent ESD currents from damaging circuit components, a path is provided between pads of the circuit. In such a manner, an ESD event between any two pads can be discharged. Furthermore, it is desirable that the path be low-resistance to reduce the likelihood that the ESD current will damage components as it travels between the two pads. Existing systems couple all rails and all pads associated with circuit blocks of a segment to a segment ground rail. Each segment ground rail is then coupled to a circuit-wide ground rail. Through the respective segment ground rails and the circuit-wide ground rail, then, each pad associated with the circuit is coupled to all other pads.

Some circuit designs require circuit segments to include a negative supply rail, e.g., in addition to a positive supply rail and segment ground rail. For example, I/O pads may require a negative supply rail so that they can swing from a negative voltage to a positive voltage. Existing ESD protection systems however cannot be extended to provide ESD protection to circuits including circuit segments that have negative supply rails. For example, diode connections between the negative supply rail and the segment ground rail or the circuit-wide ground rail may be forward biased during normal operation, resulting in undesired short circuits.

What is needed, then, is an ESD protection system that provides ESD protection for circuits including circuit segments that have negative supply rails.

BRIEF SUMMARY

Apparatuses and systems for dissipating ESD events are provided. In an embodiment, an integrated circuit (IC) device, includes a ground rail, a positive supply rail, a negative supply rail, a circuit block, a plurality of contact pads, and a coupling system. Each of the ground rail, positive supply rail, negative supply rail, and the circuit block are coupled to a respective contact pad of the plurality of contact pads. The contact pad coupled to the circuit block is configured to swing from a voltage of the negative rail to a voltage of the positive rail. The coupling system couples each contact pad of the plurality of contact pads to all other contact pads of the plurality of contact pads, whereby an electrostatic discharge (ESD) event between two contact pads of the plurality of contact pads can be dissipated.

In another embodiment, the coupling system includes a clamp that includes an inverter and a nmos transistor. A gate of the nmos transistor is coupled to an output of the inverter. The nmos transistor is formed in an isolated p-well.

In an embodiment, an integrated circuit (IC) device, includes a ground rail, a positive supply rail, a negative supply rail, a circuit block, a plurality of contact pads, and a means for coupling each contact pad of the plurality of contact pads to all other contact pads of the plurality of contact pads. Each of the ground rail, positive supply rail, negative supply rail, and the circuit block are coupled to a respective contact pad of the plurality of contact pads. The contact pad coupled to the circuit block is configured to swing from a voltage of the negative rail to a voltage of the positive rail. The means for coupling each contact pad of the plurality of contact pads to all other contact pads of the plurality of contact pads facilitates the dissipation of an electrostatic discharge (ESD) event between two contact pads of the plurality of contact pads.

These and other advantages and features will become readily apparent in view of the following detailed description of the invention. Note that the Summary and Abstract sections may set forth one or more, but not all exemplary embodiments of the present invention as contemplated by the inventor(s).

BRIEF DESCRIPTION OF THE DRAWINGS/FIGURES

The accompanying drawings, which are incorporated herein and form a part of the specification, illustrate the present invention and, together with the description, further serve to explain the principles of the invention and to enable a person skilled in the pertinent art to make and use the invention.

FIG. 1 shows a cross-sectional view of a conventional plastic quad flat package (PQFP).

FIG. 2 shows a schematic of a conventional circuit segment.

FIG. 4 shows a schematic diagram of a conventional single clamp.

Figure 3:
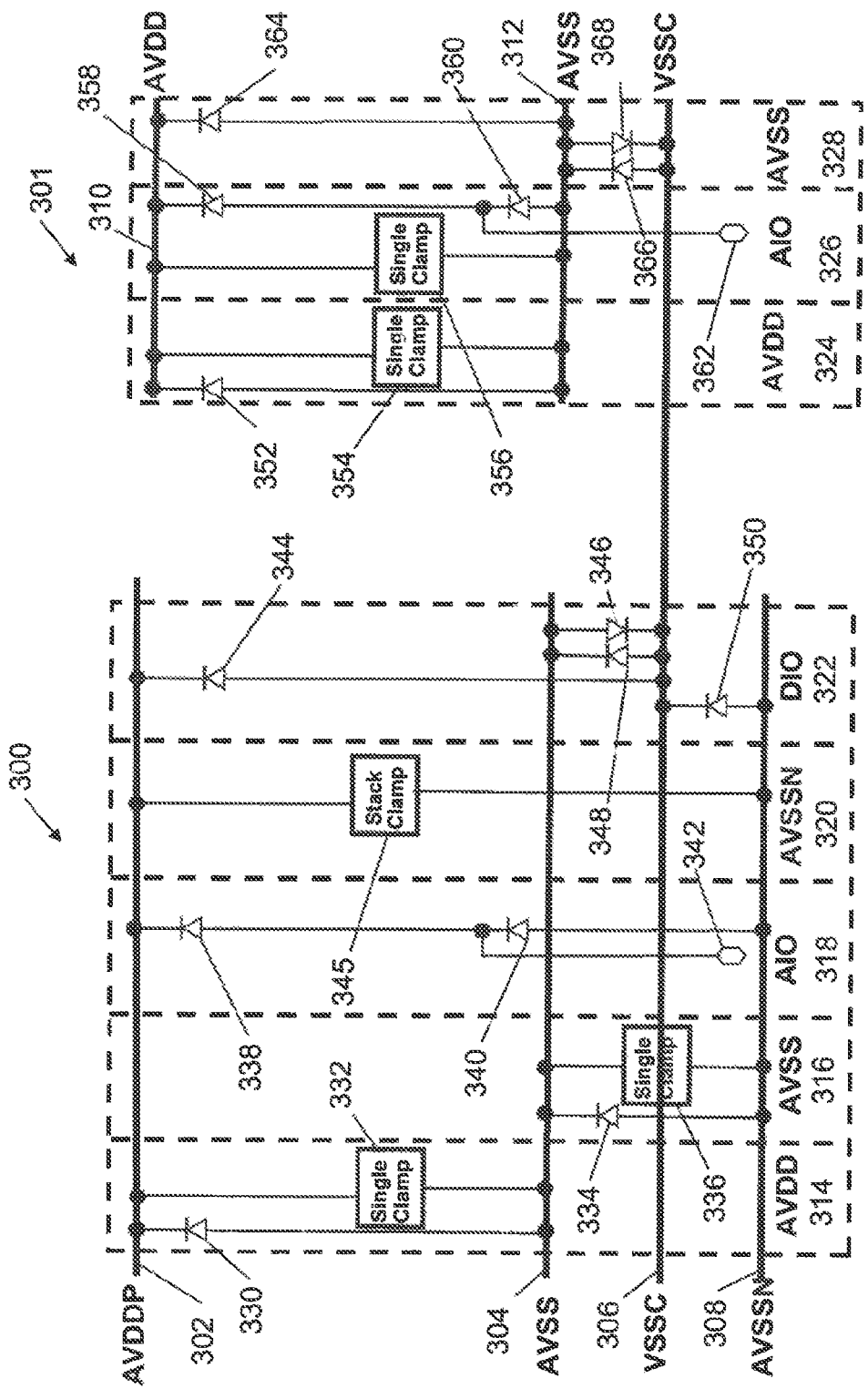
FIG. 3 shows a schematic of circuit segments, according to an embodiment of the present invention.

The present invention will now be described with reference to the accompanying drawings. In the drawings, like reference numbers indicate identical or functionally similar elements. Additionally, the left-most digit(s) of a reference number identifies the drawing in which the reference number first appears.

DETAILED DESCRIPTION OF THE INVENTION

It is to be appreciated that the Detailed Description section, and not the Summary and Abstract sections, is intended to be used to interpret the claims. The Summary and Abstract sections may set forth one or more but not all exemplary embodiments of the present invention as contemplated by the inventor(s), and thus, are not intended to limit the present invention and the appended claims in any way.

The present invention has been described above with the aid of functional building blocks illustrating the implementation of specified functions and relationships thereof. The boundaries of these functional building blocks have been arbitrarily defined herein for the convenience of the description. Alternate boundaries can be defined so long as the specified functions and relationships thereof are appropriately performed.

The foregoing description of the specific embodiments will so fully reveal the general nature of the invention that others can, by applying knowledge within the skill of the art, readily modify and/or adapt for various applications such specific embodiments, without undue experimentation, without departing from the general concept of the present invention. Therefore, such adaptations and modifications are intended to be within the meaning and range of equivalents of the disclosed embodiments, based on the teaching and guidance presented herein. It is to be understood that the phraseology or terminology herein is for the purpose of description and not of limitation, such that the terminology or phraseology of the present specification is to be interpreted by the skilled artisan in light of the teachings and guidance.

The breadth and scope of the present invention should not be limited by any of the above-described exemplary embodiments, but should be defined only in accordance with the following claims and their equivalents.

FIG. 1 shows a cross-sectional view of a conventional plastic quad flat package (PQFP) 100. An IC die 150 is attached with an adhesive 170 to a die attach pad (DAP) 140 portion of a typically copper or copper alloy leadframe 110. Contact pads 190 are coupled to leadframe leads 180 through wirebonds 130. Wirebonds 130 form electrical interconnections between die 150, DAP, and leadframe leads 180. IC die 150 and wirebonds 130 are molded in encapsulating material 120 for environmental protection, which is typically plastic. Leads 180 can be straight or bent and extend from one or more sides of package 100.

Electrostatic discharge (ESD) events can result in package 100 being exposed to high currents. The ESD currents are conducted by leads 180 and received circuit blocks of IC die 150 through contact pads 190. As would be appreciated by those skilled in the relevant art(s) based on the description herein, other packages, e.g., array-type packages, also can be subject to ESD events.

In an ESD event, a first contact pad is zapped relative to a second contact pad. The first contact pad has a lower or higher potential relative to the second contact pad. To dissipate the ESD event, it is desirable for a path to be provided between the first and second contact pads. Moreover, since the transitory voltages associated with an ESD event can be high, a low resistance path is typically desired.

FIG. 2 shows a schematic of a conventional circuit segment 200. For example, circuit segment 200 may be a portion of IC die 150 described with respect to FIG. 1. Circuit segment 200 includes a positive supply rail 202 that supplies a voltage AVDD, a segment ground rail 206, and a continuous Common ground rail 208. In an embodiment, rails 202, 206, and 208 can be implemented as circuits that include one or more of a trace, a signal plane, or a via. Rails 202, 206, and 208 provide signals to different circuit blocks of circuit segment 200 (not shown). Continuous common ground rail 208 can couple circuit segment 200 to other circuit segments. For example, continuous common ground rail 208 can couple circuit segment 200 to other circuit segments implemented in an IC die.

Circuit segment 200 further includes a coupling system including coupling devices 212-226 that couples rails 202, 206, and 208 together. By coupling together rails 202, 206, and 208 an ESD event between any two pads coupled to any of rails 202, 206, and 208 can be dissipated. Circuit segment 200 also includes an input/output (I/O) pad 210. In an embodiment, I/O pad 210 is coupled to an I/O circuit block of segment 200 (not shown). In another embodiment, I/O pad 210 is one of many pads coupled to circuit blocks of circuit segment 200. By coupling contact pads associated with circuit blocks of circuit segment 200 to one or more of rails 202, 206, and 208 and coupling rails 202, 206, and 208 to one another, ESD events between any two pads coupled to circuit blocks of circuit segment 200 can be dissipated. Moreover, by coupling all circuit segments of the IC die to continuous common ground rail 206, ESD events between any two pads of the IC die can be dissipated.

As shown in FIG. 2, positive supply rail 202 is coupled to segment ground rail 206 through diode 212 and clamp 214. When there is a positive ESD event on segment ground rail 206 or a negative ESD event on positive supply rail 202, e.g., if segment ground rail 206 is zapped relative to positive supply rail 202, diode 212 becomes forward biased and provides a low resistance path between positive supply rail 202 and ground rail 206. Although embodiments described herein refer to ESD events on rails, those skilled in the relevant art(s) will appreciate that this refers to an ESD event received by a contact pad coupled to an element that couples the IC to other devices, e.g., leads 180 described with respect to FIG. 1.

When there is a positive ESD event on positive supply rail 202 or a negative ESD event on segment ground rail 206, e.g., if positive supply rail 202 is zapped relative to segment ground rail 206, single clamp 214 provides a low resistance path the two rails. A diode facing in the opposite direction as diode 212 cannot be used to provide a conductive path between positive supply rail 202 and segment ground rail 206 when rail 202 is zapped relative to rail 206 because positive supply rail 202 is typically held at a higher potential than segment ground rail 206. Thus, there would be a short circuit between rails 202 and 206 during normal operation if a diode were used. Single clamp 214 allows for a conductive path between positive supply rail 202 and segment ground rail 206 to be provided only When there is an ESD event so as to avoid a short circuit during normal operation. Similarly, single clamp 216 couples rail 202 to rail 206. Thus, clamps 214 and 216 provide parallel coupling between rails 202 and 206. In such a manner, the ESD current that travels between rails 202 and 206 is split between clamps 214 and 216, reducing the likelihood that either of clamps 214 and 216 will be damaged. Moreover, such a parallel coupling provides a lower resistance between rails 202 and 206.

I/O pad 210 is coupled to positive supply rail 202 through diode 218. Diode 218 provides a path between I/O pad 210 and rail 202 when a positive event occurs on I/O pin 210. Through diode 218, the ESD current is conducted to positive supply rail 202 and to segment ground rail 206 through clamps 214 and 216. A diode 220 provides a path between I/O pad 210 and segment ground rail 206 when there is a negative ESD event on I/O pad 210. Diode 222 provides a conductive path between segment ground rail 206 and positive supply rail 202 when there is a positive ESD event on segment ground rail 206 in parallel with diode 212. Thus, all ESD events, on pads coupled to rails or other circuit blocks of circuit segment 200, are passed to segment ground rail 206. Segment ground rail 206 is coupled to continuous common ground rail 208 through diodes 224 and 226. Diode 224 provides a conductive path between continuous common ground rail 208 and segment ground rail 206 when there is a positive ESD event on continuous common ground rail 208 or a negative ESD event on segment ground rail 206. For example, there may be a positive ESD event on another circuit segment coupled to rail 208. Similarly, diode 226 provides a conductive path between segment ground rail 206 and continuous common ground rail 208 when there is a positive ESD event on segment ground rail 206 or a negative ESD event on rail 208. Through respective segment rails, e.g., ground or supply, and device wide continuous common ground rail 208, all pads associated with an IC can be coupled to all other pads of the IC.

Although the conventional technique depicted in FIG. 2 provides for ESD protection in circuit segments that include positive supply rails and segment grounds, such a configuration may not be able to provide ESD protection when a negative supply rail is also included in the circuit segment. A negative supply rail may be included so that certain pads, e.g., I/O pads, can swing from a negative voltage to a positive voltage. Traditional techniques involving coupling all rails to the segment ground rail using diodes often are not effective when the circuit segment includes a negative supply rail. For example, to obtain sufficient swing for an I/O pad, the I/O pad may be need to be coupled to both the positive supply rail and the negative supply rail. Thus, such an I/O pad cannot be coupled to a segment ground, as is the case in FIG. 2, because it would not be able to realize the desired voltage swing. Furthermore, the traditional technique cannot simply be amended to have all segment rails coupled to the negative rail instead of the segment ground, e.g., treat the negative rail as the segment rail for ESD purposes. Diodes between the negative rail and the continuous common ground rail would be forward biased during normal operation, resulting in an undesirable short circuit.

FIG. 3 shows a schematic of circuit segments 300 and 301, according to an embodiment of the present invention. In an embodiment, circuit segments 300 and 301 may be portions of an IC die similar to IC die 150 described with respect to FIG. 1. In an embodiment, segment 300 is an analog audio segment and segment 301 is a different analog segment. However, the invention is not limited to analog segments or analog audio segments, and other types of circuits can be used for segment 300. Segment 300 includes a positive supply rail 302 that supplies a voltage AVDDP, a segment ground rail 304 that supplies a segment ground AVSS, and a negative supply rail 308 that supplies a voltage AVSSN. In an embodiment, AVSSN is approximately −2.5V.

Segment 301 includes a positive supply rail 310 that supplies a voltage AVDD, and a segment ground rail 312 that supplies a ground voltage AVSS. FIG. 3 also includes a continuous common ground rail 306 that couples segments 300 and 301. In a further embodiment, continuous common ground rail 306 couples all segments of the IC together. In an embodiment, rails 302-312 are structurally similar to rails 202, 206, and 208 described with reference to FIG. 2. For example, one or more of rails 302-312 may be circuits that include at least one of a circuit trace, a signal plane, or via.

Each of rails 301-312 can be coupled to one or more contact pads. For example, one or more rails may be coupled to contact pads similar to contact pads 190 described with respect to FIG. 1. Furthermore, each of segments 300 and 301 can also include circuit blocks that are coupled to additional contact pads. For example, each of segments 300 and 301 can include respective I/O circuit blocks (not shown) coupled to I/O contact pads 342 and 362, respectively. As described above, to provide ESD protection it is desirable to couple all pads to all other contact pads of the IC. This includes coupling contact pads to all other contact pads coupled to circuit blocks or rails of that particular segment and all other segments of the IC. In embodiments described herein, coupling devices and a coupling system are provided that allow for each contact pad of an IC to be coupled to all other pads of the IC even when one or more of the segments include a negative supply rail.

Segment 300 includes cells 314-322 that include coupling devices that together form a coupling system that couples all contact pads to all other contact pads of segment 300 and to continuous common ground rail 306. For example, AVDD cell 314 couples positive supply rail 302 and segment ground rail 304. Specifically, AVDD cell 314 includes a diode 330 and a clamp 332. Diode 330 provides a path when there is a positive ESD event on segment ground rail 304 or a negative ESD event on positive supply rail 302. Single clamp 332 provides a path when there is a positive event on positive supply rail 302 or a negative event on segment ground rail 304. As described above, clamps may be used to provide path from a first element, e.g., positive supply rail 302, to a second element, e.g., segment ground rail 304, where the first element has a higher voltage than the second during normal operation, such that the path is only provided during an ESD event and not during normal operation.

AVSS cell 316 couples segment ground rail 304 and negative supply rail 308. AVSS cell 316 includes a diode 334 and a clamp 336. Diode 334 provides a path when there is a positive event on negative supply rail 308 or a negative ESD event on segment ground rail 304. Single clamp 336 provides a path when there is a positive ESD event on segment ground rail 304 or a negative ESD event on negative supply rail 308.

AIO cell 318 couples AIO pad 342 to positive supply rail 302 and negative supply rail 308. AIO cell 318 includes diodes 338 and 340. Diode 338 provides a conduction path between I/O pad 342 and positive supply rail 302 when there is a positive ESD event on I/O pad 342 or a negative ESD even on positive supply rail 302. Diode 340 provides a conduction path between I/O pad 342 and negative supply rail 308 when there is a negative ESD event on I/O pad 342 or a positive ESD event on negative supply rail 308.

AVSSN cell 320 couples positive supply rail 302 to negative supply rail 308. AVSSN cell 320 includes a stacked clamp 345 that provides a conduction path when there is a positive ESD event on a contact pad coupled to positive supply rail 302 or a negative ESD event on a contact pad coupled to negative supply rail 308. Stacked clamps similar to stacked clamp 345 that are to be used in systems that include a negative supply rail will be described farther detail below.

DIO cell 322 couples positive supply rail 302, negative supply rail 308, and segment ground rail 304 to continuous common ground rail 306. DIO cell 322 includes diodes 344-350. Diode 344 provides a path between continuous common ground rail 306 and positive supply rail 302 when there is either a positive ESD event on continuous common ground rail 306 or a negative ESD event on positive supply rail 302. Diode 348 provides a conduction path when there is either a positive ESD event on continuous common ground rail 306 or a negative ESD event on segment ground rail 304. Diode 346 provides a conduction path when there is either a positive ESD event on segment ground rail 304 or a negative ESD event on continuous common ground rail 306. Diode 350 provides a conduction path when there is either a positive ESD event on negative supply rail 308 or a negative ESD event on continuous ground rail 306.

Segment 301 includes cells 324-328 that each include coupling devices that together allow ESD events to be dissipated. AVDD cell 324 includes a diode 352 and a single clamp 354. Diode 352 provides a conduction path between a positive supply rail 310 and segment ground rail 312 when there is a positive ESD event on segment ground rail 312 or a negative ESD event on positive supply rail 310. Single clamp 354 provides a conduction path between positive supply rail 310 and segment ground rail 312 when there is a positive ESD event on rail 310 or a negative ESD event on rail 312.

AIO cell 326 includes diodes 358 and 360 and a single clamp 356. Single clamp 356 provides a conduction path between segment ground rail 312 and positive supply rail 310. Single clamp 356 provides a conduction path when there is a positive ESD event on positive supply rail 310 or a negative ESD event on negative supply rail 312. As shown in FIG. 3, segment 301 does not include a negative supply rail. In an embodiment, circuit blocks of segment 301 do not require a negative supply rail. For example, the I/O circuit block coupled to I/O pad 362 may not require a negative supply rail. In a further embodiment, I/O pad 362 may not have to swing between a negative and a positive voltage, AVSS cell 328 includes diodes 364-368. Diode 364 provides a path between segment ground rail 312 and positive supply rail 310 when there is a positive ESD event on segment ground rail 312 or a negative ESD event on positive supply rail 310. Diodes 366 and 368, similar to diodes 348 and 346 in DIO cell 322, couple segment ground rail 312 to continuous common ground rail 306. Specifically, diode 366 provides a conduction path between continuous common ground rail 306 and segment ground rail 312 when there is a positive ESD event on continuous common ground rail 306 or a negative ESD event on segment ground rail 312. Diode 368 provides a conduction path when there is a positive ESD event on segment ground rail 312 or a negative ESD event on continuous common ground rail 306. Thus, AVSS cell 328, similar to DIO cell 322, couples segment 301 to continuous common ground rail 306. In an embodiment, all other cells of the integrated circuit may have cells similar to DIO cell 322 or AVSS cell 328 so that they are coupled to continuous common ground rail 306. For example, segments similar to segment 300 that include a negative supply rail may have a cell similar to DIO cell 322 and cells segments similar to segment 301 that do not include a negative supply rail may have a cell similar to AVSS cell 328.

The conduction paths provided by the coupling devices shown in FIG. 3 are described above in terms of ESD events on contact pads that are coupled to one or more of rails 302-312. However, these coupling device also provide a conduction path when they receive an ESD current that originated elsewhere. For example, diode 330 provides a conduction path when there is either a positive ESD event on segment ground rail 304 or a negative ESD event on positive supply rail 302. However, diode 330 also provides a conduction path when it receives an ESD current that originates from a ESD event on another pad. For example, a positive ESD event on negative supply rail 308 may result in a current that is conducted through diode 334. This current is then conducted by diode 330 to positive supply rail 302. Once the ESD current is passed to segment ground rail 304 it is as if there has been an ESD event on segment ground rail 304.

In an embodiment, cells 314-328 can be repeated as necessary according to the design of that segment or the needs of a circuit block within that segment. For example, AIO cell 318 can. be repeated for each I/O pad coupled to the I/O circuit block of segment 300. Each of these cells provide coupling required for ESD event dissipation and allow I/O pad 342 to swing from negative voltage AVSSN to positive AVDD. In other embodiments, other cells of cells 314-328 can be repeated. Thus, organizing the various coupling devices in segments 300 and 301 allows for a flexible ESD dissipation design that can be adjusted based on the needs of a segment and/or circuit blocks within a segment.

Through the coupling devices included in each of cells 314-328, each contact pad that is coupled to portions of the IC is coupled to every other contact pad so that an ESD event between any two contact pads can be dissipated. In a further embodiment, multiple paths are provided between the contact pads. Doing so reduces the current that passes through any one device, thus reducing the chance that the device will be damaged during the ESD event. For example, there may be an ESD event between I/O pad 362 and I/O pad 342. In other words, I/O pad 362 may be zapped relative to I/O pad 342. The ESD current travels from pad 362 through diode 358 to positive supply rail 310. From positive supply rail 310, the ESD current travels to segment ground rail 312 through single clamps 354 and 356 and to continuous common ground rail 306 through diode 368. Through continuous common ground rail 306 the ESD current can travel from segment 301 to segment 300. The ESD current is passed through diode 344 to positive supply rail 302. From positive supply rail 302, the ESD current is passed to negative supply rail 308 through stacked clamp 345 and clamps 332 and 336 and finally to pad 342 through diode 340. Thus, the ESD event on pad 362 is dissipated. As described above, there may be more than one path between any two pads. For example, in addition to passing ESD current from continuous common ground rail 306 to positive supply rail 302 (and then to pad 342 through negative supply rail 308 and diode 340) the ESD current can also be passed to segment ground rail 304 through diode 348. From segment ground rail 304, the ESD current can be passed to negative supply rail 308 through single clamp 336 and then to pad 342 through diode 340. In a further embodiment, the two discharge paths described above are effectively in parallel, thus the current that passes through different devices of segment 301 can be reduced so that the ESD event can be dissipated without damaging the devices. In a further embodiment, segment 301 similarly includes multiple paths between different rails so that ESD current can be passed in parallel, thereby reducing the current that passes through any single device. For example, clamp 356 is in parallel with clamp 354. Thus, the system of coupling devices provided in the cells 314-328 provide multiple paths between any two contact pads so that ESD events between two contact pads can be discharged without damaging the coupling devices. As would be appreciated by those skilled in the relevant art(s) based on the description herein, ESD events between other contact pads coupled to aspects of segment 300 and/or segment 301 can similarly be discharged through the coupling devices provided in FIG. 3. In a further embodiment, an ESD event between pads 362 and 342 may be a worst-case scenario because the pads are coupled to circuit blocks of different segments. This may be a worst-case scenario because of the distance that separates segments 300 and 301 and the complexity of the circuits required to pass an ESD event between segments 300 and 301. However, even in this worst-case scenario, as describe above, an ESD event can be dissipated.

FIG. 4 shows a schematic diagram of a conventional single clamp 400. In an embodiment, single clamps 332, 354, and 356 may be substantially similar to single clamp 400. Clamp 400 includes resistors 402 and 404, pmos transistors 406 and 408, and nmos transistors 410-414, and diodes 416 and 418. Exemplary dimensions and values for the components of clamp 400 are shown in FIG. 4.

Pmos transistor 406 is grounded and acts as a capacitor. Pmos transistor 406, then, forms an RC circuit with resistor 402. In an alternate embodiment, pmos transistor 406 and resistor 402 may be omitted from clamp 400.

Pmos transistor 408 and nmos transistor 412 form an inverter. As shown in FIG. 4, the input of the inverter is controlled by the RC circuit. The output of the inverter controls the gate of nmos transistor 414. In an embodiment, nmos transistor 414 is a relatively large transistor that it capable of shunting a large ESD current, e.g., nmos transistor may have a width/length (W/L) of 31 µm/0.35 µm compared to a W/L of nmos transistor 412 of 3 µm/0.39 µm. When there is an ESD event on pad 420, the RC circuit holds the input to the inverter low. The output of the inverter then is high, effectively turning on nmos transistor 414. Once nmos transistor 414 has been turned on, it shunts the ESD current as desired.

Single clamp 400 shunts current when there is an ESD event and it is coupled to a ground rail, e.g., segment ground rail 304. However, when clamp 400 is instead coupled to a negative power supply, e.g., similar to single clamp 336, the bulk connection of the nmos transistors 410-414 may be forward biased, leading to an undesired short circuit.

Clamp 400 also includes diodes 416 and 418. In an embodiment, diodes 416 and 418 allow for current to travel in the opposite direction as the current traveling through nmost transistor 414 effectively making clamp 400 a bidirectional device. Diodes 416 and 418 can be provided in addition to or instead of other diodes that provide a path in the reverse direction. For example, if clamp 332 is implemented similar to clamp 400, diodes 416 and 418 can be provided in addition to diode 330 or instead of diode 330. In alternate embodiments, diodes 416 and 418 can be omitted from clamp 400.

Figure 5:
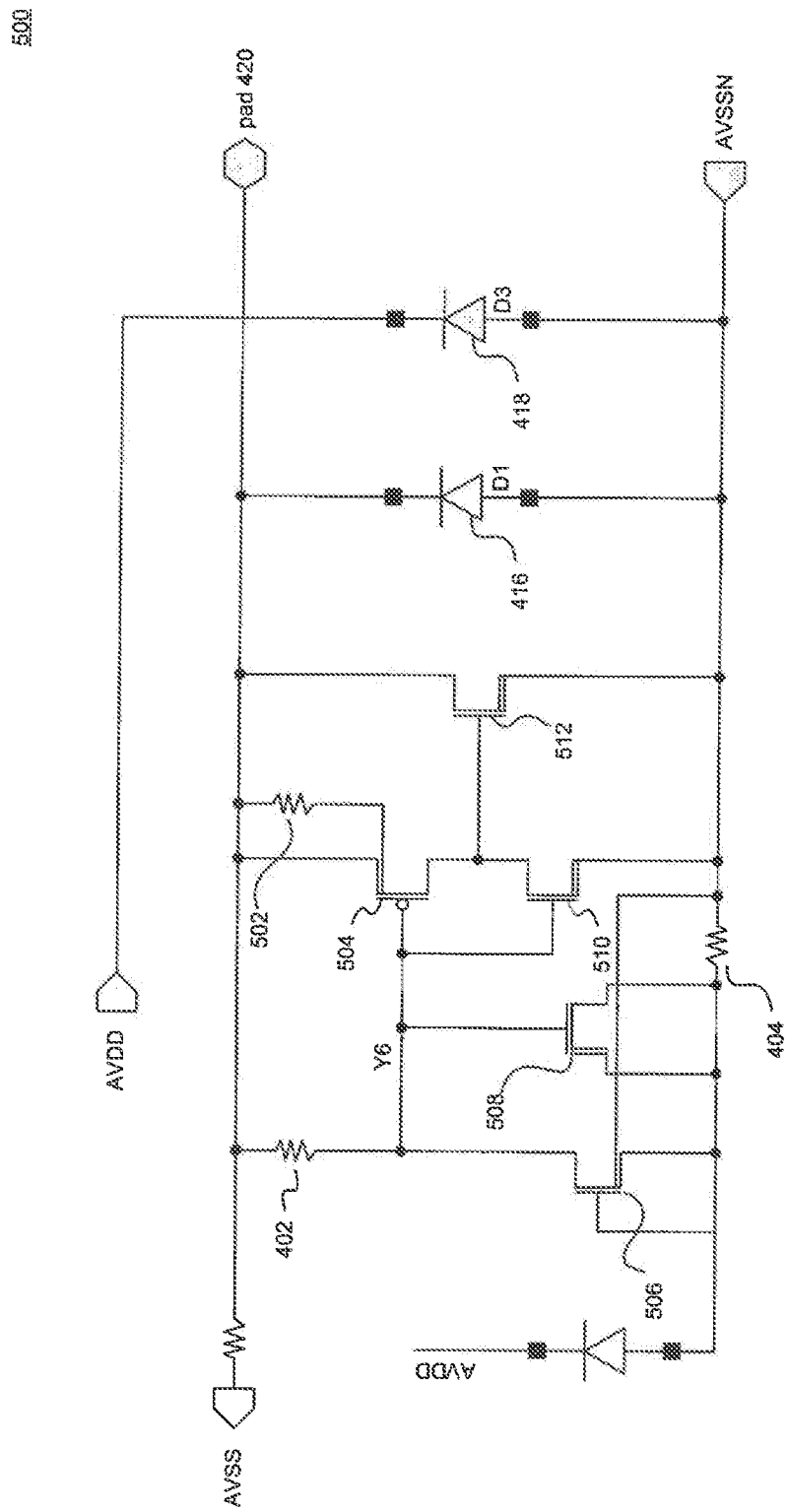
FIG. 5 shows a schematic diagram of a single clamp, according to an embodiment of the present invention.

FIG. 5 shows a schematic diagram of a single clamp 500, according to an embodiment of the present invention. For example, single clamp 336, shown in FIG. 3, may be similar to clamp 500. Clamp 500 includes resistors 402, 404, and 502, diodes 416 and 418, a pmos transistor 504, and nmos transistors 506-512. Single clamp 500 is substantially similar to single clamp 400 shown in FIG. 5 except that pmos transistor 406 in single clamp 400 is replaced with an nmos transistor 508 in single clamp 500. Similar to pmos transistor 406, described above with respect to FIG. 4, nmos transistor 508 operates as a capacitor and along with resistor 402 forms an RC circuit that holds the input of the inverter formed by transistors 504 and 510 low during an ESD event. In another embodiment, transistor 508 can be replaced with a capacitor to form the RC circuit, e.g., a metal capacitor may be used.

Furthermore, nmos transistors 506-512 are formed in an isolated p-well that isolates them and ties them to the most negative supply so that their respective bulks are not forward biased. Also, clamp 500 further includes resistor 502 that can prevent latch up in pmos transistor 504. By forming all of the nmos devices in an isolated p-well, single clamp 500 may be used where it is coupled to a negative supply rail instead of ground.

Figure 6:
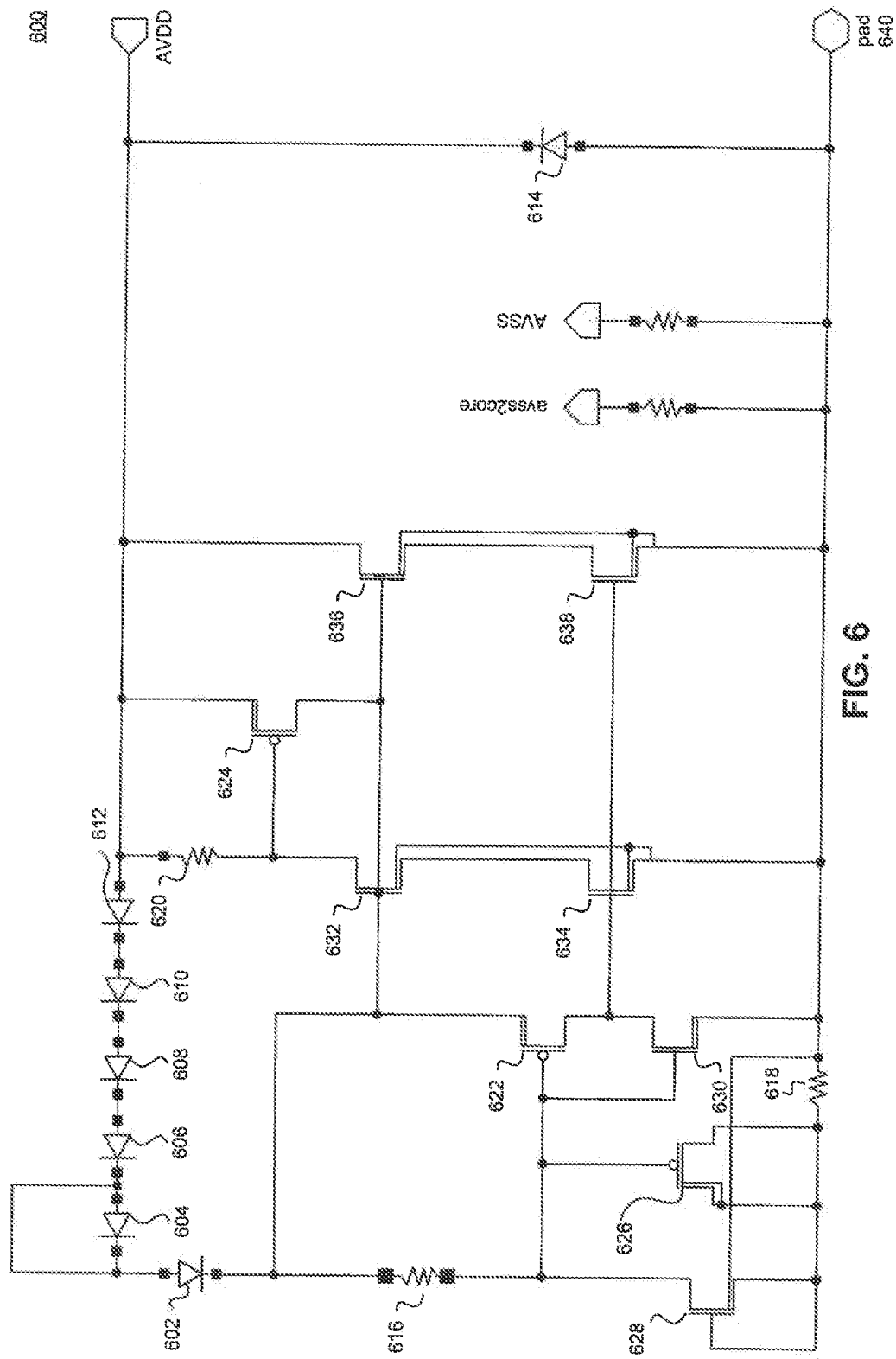
FIG. 6 shows a schematic diagram of a stacked clamp.

FIG. 6 shows a schematic diagram of a stacked clamp 600. Stacked clamp 600 includes diodes 602-614, resistors 616-620, pmos transistors 622-626, and nmos transistors 628-638. Stacked clamp 600 works in a manner substantially similar to single clamp 400 shown in FIG. 4. Pmos transistor 626, similar to pmos transistor 406 in single clamp 400, is grounded and acts as a capacitor. Pmos transistor 626, then, along with resistor 616 forms a RC circuit. Pmos transistor 622 and nmos transistor 630 form an inverter. The inverter takes the output of the RC circuit as its input. Nmos transistors 632-638 are a set of cascaded nmos transistors that pass current during an ESD event on pad 640. Nmos transistors 634 and 638 are driven by the inverter. Diodes 602-612 form a diode string that provides correct bias to transistors 632 and 636. Essentially, diodes 602-612 step down the voltage that nmos transistors 632-638 see so as to not stress these devices. Resistor 620 and pmos transistor 624 form a device that is used to turn on nmos transistors 632-638 during an ESD event. It is generally desirable to turn on stacked clamp 600 as quickly as possible during an ESD event so that the ESD current can be safely shunted. The device formed by resistor 620 and pmos transistor 624 powers the inverter and nmos transistors 632 and 636. Through its capacitance, pmos transistor 624 holds its gate low and thus the gates of nmos transistors 632 and 636 high. In alternate embodiments, stacked clamp 600 may not include this device. However, in those embodiments, the stacked clamp may not turn on as quickly because transistors 632-638 would have to wait for diodes 602-612 to turn on. With this device, diodes 602-612 are essentially bypassed during a transient ESD event.

Diode 614, similar to diodes 416 and 418 described with respect to FIG. 4, can be used to provide a path in the opposite direction as cascoded nmos transistors 632-638, thereby making clamp 600 a bidirectional device.

Similar to single clamp 500 described with reference to FIG. 5, stacked clamp 600 may also encounter problems when it is used coupled to a negative power supply. In particular, the bulk source junctions of nmos transistors 628-638 may be forward biased.

Figure 7:
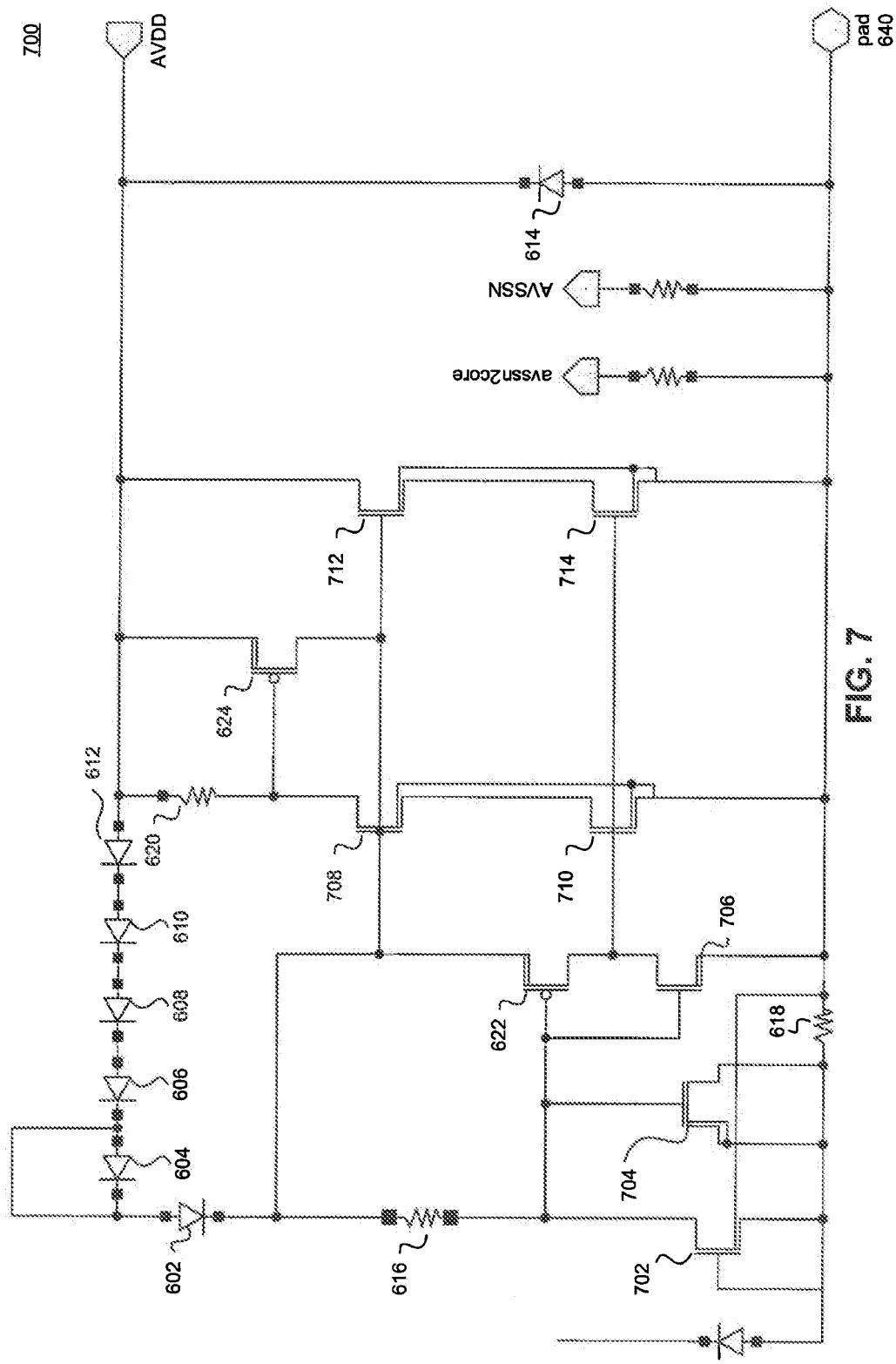
FIG. 7 shows a schematic of a stacked clamp, according to an embodiment of the present invention.

FIG. 7 shows a schematic of a stacked clamp 700, according to an embodiment of the present invention. For example, stacked clamp 700 may be used for stacked clamp 345, described with reference to FIG. 3. Stacked clamp 700 includes diodes 602-614, resistors 616-620, pmos transistors 624 and 626, and nmos transistors 702-712. Stacked clamp 700 is substantially similar to stacked clamp 600 described with reference to FIG. 6 except that pmos transistor 626 is replaced with ratios transistor 904. Also, nmos transistors 902-912, are formed in an isolated p-well so that their respective bulk connections are not forward biased.

Conclusion

While various embodiments of the present invention have been described above, it should be understood that they have been presented by way of example only, and not limitation. It will be apparent to persons skilled in the relevant art that various changes in form and detail can be made therein without departing from the spirit and scope of the invention. Thus, the breadth and scope of the present invention should not be limited by any of the above-described exemplary embodiments, but should be defined only in accordance with the following claims and their equivalents.

What is claimed is:

1. An integrated circuit (IC) device, comprising:
   a ground rail;
   a positive supply rail;
   a negative supply rail;
   a circuit block;
   a plurality of contact pads, wherein the circuit block is configured to output an output voltage via a first contact pad of the plurality of contact pads and wherein a range of the output voltage is between a voltage of the positive supply rail and a voltage of the negative supply rail; and
   a coupling system that couples the first contact pad to a second contact pad of the plurality of contact pads so as to dissipate an electrostatic discharge (ESD) event between the first and second contact pads.

2. The IC device of claim 1, wherein the coupling system comprises at least one of a diode or a clamp.

3. The IC device of claim 2, wherein the clamp is a stacked clamp.

4. The IC device of claim 2, wherein the clamp comprises a nmos transistor.

5. The IC device of claim 4, wherein the nmos transistor is formed in an isolated p-well.

6. The IC device of claim 5, wherein the clamp further comprises an inverter, and herein a gate of the nmos transistor is coupled to an output of the inverter.

7. The IC device of claim 1, wherein the ground rail, the positive supply rail, the negative supply rail, and the circuit block are part of a first segment of the IC device, and wherein the IC device further comprises a second segment, the second segment comprising:
- a second ground rail;
- a second positive supply rail; and
- a second circuit block;
- wherein each of the second ground rail, second positive supply rail, and the second circuit block are coupled to a respective contact pad of the plurality of contact pads.

8. The IC device of claim 7, further comprising: a third ground rail, wherein the third ground rail couples the first ground rail to the second ground rail.

9. The IC device of claim 1, wherein the coupling system comprises:
- a first cell that couples the positive supply rail and the ground rail;
- a second cell that couples the negative supply rail and the ground rail;
- a third cell that couples the negative supply rail and the positive supply rail; and
- a fourth cell that couples the positive supply rail, the ground rail, and the negative supply rail.

10. The IC device of claim 9, wherein at least one of the first, second, third, and fourth cells includes at least one of a diode or a clamp.

11. The IC device of claim 1, wherein the circuit block is an input/output circuit block.

12. The IC device of claim 1, wherein each of the ground rail, the positive supply rail, and the negative supply rail is coupled to a respective contact pad of the plurality of contact pads.

13. The IC device of claim 1, wherein the coupling system is configured to electrically couple each contact pad of the plurality of contact pads to all other contact pads of the plurality of contact pads.

14. An integrated circuit (IC) device, comprising:
- a ground rail;
- a positive supply rail;
- a negative supply rail;
- a circuit block;
- a plurality of contact pads, wherein the circuit block is configured to output an output voltage via a first contact pad of the plurality of contact pads and wherein a range of the output voltage is between a voltage of the positive supply rail and a voltage of the negative supply rail; and
- means for coupling the first contact pad to a second contact pad of the plurality of contact pads to dissipate an electrostatic discharge (ESD) event between the first and second contact pads.

15. The IC device of claim 14, wherein the ground rail, the positive supply rail, the negative supply rail, and the circuit block are part of a first segment of the IC device, and wherein the IC device further comprises a second segment, the second segment comprising:
- a second ground rail;
- a second positive supply rail; and
- a second circuit block;
- wherein each of the second ground rail, second positive supply rail, and the second circuit block are coupled to a. respective contact pad of the plurality of contact pads.

16. The IC device of claim 15, further comprising: a third ground rail, wherein the third ground rail couples the first ground rail to the second ground rail.

17. The IC device of claim 14, wherein each of the ground rail, the positive supply rail, and the negative supply rail is coupled to a respective contact pad of the plurality of contact pads.

18. The IC device of claim 14, wherein the means for coupling electrically couples each contact pad of the plurality of contact pads to all other contact pads of the plurality of contact pads.

19. The IC device of claim 14, wherein the means for coupling provides multiple conduction paths between the first and second contact pads.

20. An integrated circuit (IC) device, comprising:
- a ground rail;
- a positive supply rail;
- a negative supply rail;
- a circuit block;
- a plurality of contact pads, wherein the circuit block is configured to output an output voltage via a first contact pad of the plurality of contact pads; and
- a coupling system that couples the first contact pad to a second contact pad of the plurality of contact pads to dissipate an electrostatic discharge (ESD) event between the first and second contact pads, the coupling system including:
  - a first cell that couples the positive supply rail and the ground rail;
  - a second cell that couples the negative supply rail and the ground rail; and
  - a third cell that couples the negative supply rail and the positive supply rail.

* * * * *

UNITED STATES PATENT AND TRADEMARK OFFICE
CERTIFICATE OF CORRECTION

PATENT NO. : 9,059,583 B2  Page 1 of 1
APPLICATION NO. : 14/153634
DATED : June 16, 2015
INVENTOR(S) : Venkatasubramanian et al.

It is certified that error appears in the above-identified patent and that said Letters Patent is hereby corrected as shown below:

In the Claims
In column 11, line 2, please replace "herein" with --wherein--.
In column 12, lines 14-15, please replace "to a. respective" with --to a respective--.

Signed and Sealed this
Twenty-sixth Day of April, 2016

Michelle K. Lee
*Director of the United States Patent and Trademark Office*